United States Patent
Freund et al.

[19]

[11] Patent Number: 5,876,179
[45] Date of Patent: Mar. 2, 1999

[54] VACUUM-CONTROLLED COLLET FOR MANIPULATION OF SEMICONDUCTOR PARTS

[75] Inventors: Joseph Michael Freund, Fogelsville; George John Przybylek, Douglasville; Dennis Mark Romero, Allentown; John William Stayt, Jr., Schnecksville, all of Pa.

[73] Assignee: Lucent Technologies, Inc., Murray Hill, N.J.

[21] Appl. No.: 8,278

[22] Filed: Jan. 16, 1998

[51] Int. Cl.$^6$ .................................................. B65G 47/252
[52] U.S. Cl. .......................... 414/783; 198/380; 414/816
[58] Field of Search ............................. 198/380; 414/755, 414/768, 783, 816

[56] References Cited

U.S. PATENT DOCUMENTS 3,176,825   4/1965   Rudszinat et al. ................... 198/380 X

*Primary Examiner*—Janice L. Krizek

[57] ABSTRACT

A vacuum collet for handling semiconductor piece parts is formed to include a plurality of separate vacuum ports, disposed in proximity to one another. By selectively turning the vacuum ports "on" and "off", with only one vacuum port turned "on" at a time, a semiconductor chip may be articulated through various 90° rotations to provide the orientation required for placement of the semiconductor chip on a final assembly.

7 Claims, 2 Drawing Sheets

VACUUM-CONTROLLED COLLET FOR MANIPULATION OF SEMICONDUCTOR PARTS

TECHNICAL FIELD

The present invention relates to a collet for handling semiconductor parts and, more particularly, to a vacuum-controlled collet that allows for precise handling and orientation of the handled parts.

BACKGROUND OF THE INVENTION

In the assembly of semiconductor-based arrangements it is necessary that relatively small parts (on the order of 0.4"×0.012"×0.004" in dimensions) be picked up and accurately placed within the package. In the assembly of optoelectronic systems, the necessity to accurately orient and align optical components, such as semiconductor lasers, is critical. At the present time, the "picking and placing" of semiconductor parts requires an individual (referred to as an operator) to manually pick up the small semiconductor using a narrow, vacuum-tipped wand. Once the part is picked up, the operator must manually articulate the part to place it in its proper location. Due to the small size and fragility of the semiconductor piece parts, breakage occurs on a regular basis.

Thus, a need remains for a method of picking and placing small semiconductor devices that allows for relatively easy articulation of the piece part, while avoiding damage to the semiconductor device.

SUMMARY OF THE INVENTION

The need remaining in the art is addressed by the present invention, which relates to a collet for handling semiconductor parts and, more particularly, to a vacuum-controlled collet that allows for precise handling and orientation of the handled parts.

In accordance with the teachings of the present invention, a collet is formed to including a plurality of vacuum ports, with each port being separately activated. In use, a first vacuum is turned "on" and a semiconductor is picked up and held in place by that port. To re-orient the piece part by 90°, the first part is turned "off" and a second, adjacent vacuum port is turned "on". The vacuum action will rotate the part and pull it towards the second vacuum port. A third vacuum port may be included to provide another 90° rotation. Additional ports may be included if additional orientation flexibility is desired. As long as the vacuum ports are controlled sequentially, the semiconductor piece part can be articulated into the desired orientation for placement without damage to the part.

Other and further advantages of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
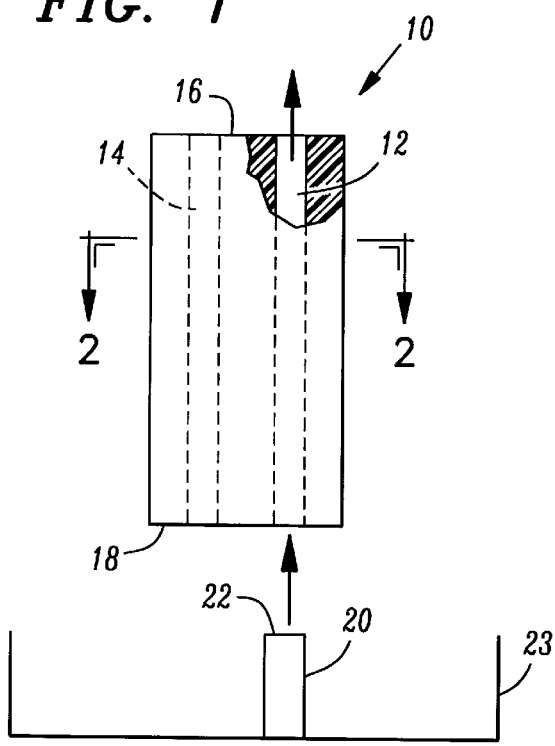
FIG. 1 is a cut-away side view of an exemplary collet formed in accordance with the present invention, with a first vacuum port activated to draw up a semiconductor piece part.
Figure 2:
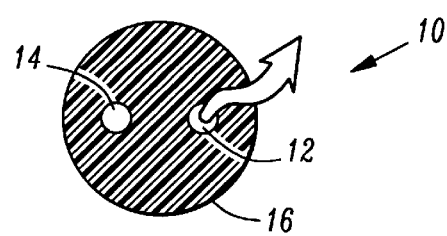
FIG. 2 is a top view of the collet of FIG. 1.
Figure 3:
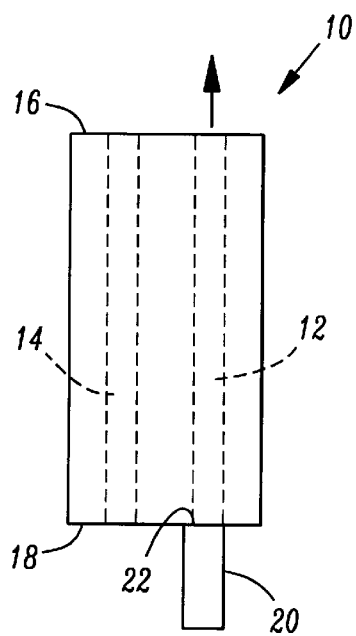
FIG. 3 is a cut-away side view of the collet of FIG. 1, with the semiconductor piece part held in place by a vacuum applied to a first vacuum port.

A cut-away side view of an end portion of a collet 10 formed in accordance with the present invention is illustrated in FIG. 1. Although the collet as shown in the figures is cylindrical in form, it is to be understood that various other geometries may be used. Referring to FIG. 1, collet 10 includes a first vacuum port 12 and a second vacuum port 14 disposed through the length of collet 10 from a top endface 16 to a bottom endface 18. Vacuum ports 12 and 14 are separately activated and are controlled by a separate vacuum source (not shown). For the arrangement of FIG. 1, first vacuum port 12 is activated, indicated by the upward arrow, and second vacuum port 14 is turned "off", indicated by the shading in FIG. 1. FIG. 2 is a top view of collet 10, illustrating in particular the location of first and second vacuum ports 12 and 14 with respect to top endface 16 of collet 10.

Referring back to FIG. 1, a semiconductor device 20, such as a laser chip, is shown as disposed on a processing holder 23. When collet 10, with first vacuum port 12 turned "on" approaches piece part 20, the vacuum will draw chip 20 toward bottom endface 18 of collet 10. As long as first vacuum port 12 is "on", top surface 22 of chip 20 will be held immovable against endface 18 at the exit of first port 12.

Figure 4:
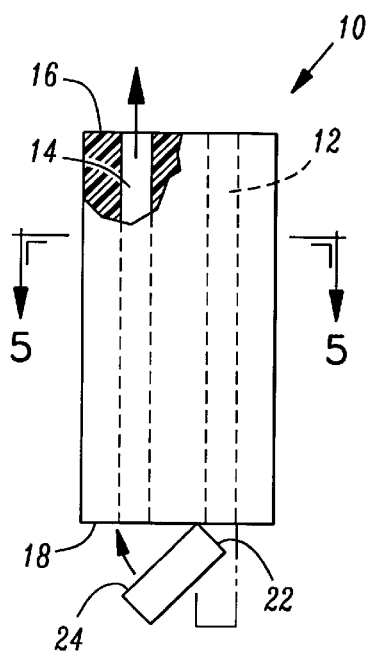
FIG. 4 is a cut-away side view of the collet of FIG. 1, with the first vacuum port turned "off" the second vacuum port turned "on", indicating the articulation of the semiconductor piece part.
Figure 5:
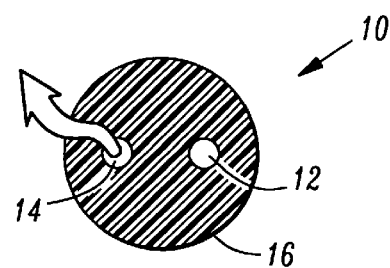
FIG. 5 is a top view of the collet of FIG. 4.

In accordance with the teachings of the present invention, chip 20 may be articulated 90° by turning "off" first vacuum port 12 and turning "on" second vacuum port 14. FIG. 4 illustrates this step in the process, where first vacuum port 12 is shaded as being "off", and the upward arrow above second vacuum port 14 indicates that vacuum port 14 has been turned "on". FIG. 5 is a top view of the arrangement of FIG. 4, indicating that first vacuum port 12 is closed and second vacuum port 14 is open.

Figure 6:
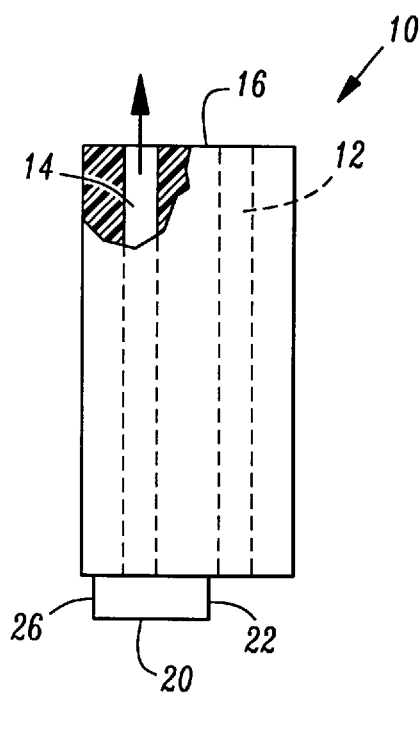
FIG. 6 is a cut-away side view of the collet of FIG. 4, with the semiconductor piece part held in place by a vacuum applied to the second vacuum port.

Once the vacuum ports have been changed such that first vacuum port 12 has been shut off, and second vacuum port 14 has been opened, chip 20 will begin to rotate in the manner shown in FIG. 4. In particular, side surface 24 of chip 20 will be drawn against bottom endface 18 of collet 10 in the vicinity of second vacuum port 14, as shown in FIG. 6. Therefore, in accordance with the teachings of the present invention, chip 20 has been rotated 90° by the switching action between first and second vacuum ports 12 and 14.

Figure 7:
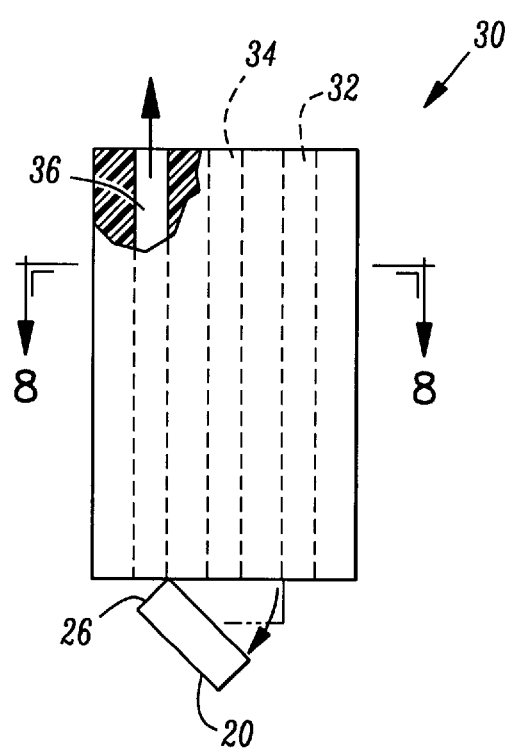
FIG. 7 is a cut-away side view of an alternative collet formed in accordance with the present invention, the collet as illustrated in FIG. 7 including a set of three vacuum ports.
Figure 8:
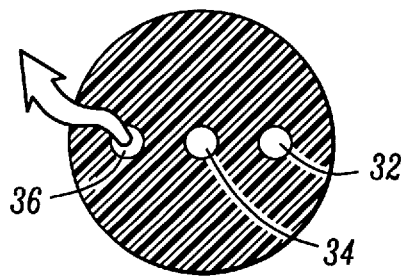
FIG. 8 is a top view of the collet of FIG. 7.
Figure 9:
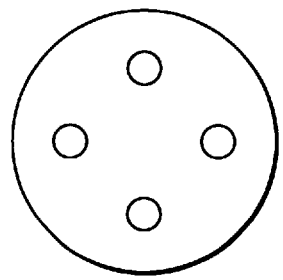
FIG. 9 is a top view of yet another embodiment of the present invention, in this case the collet comprising a set of four separate vacuum ports.

There may be other manufacturing processes where it is necessary to articulate a semiconductor chip a number of times before it is properly oriented. In these cases, a collet may be used that includes three (or more) vacuum ports. FIG. 7 is a cut-away side view of a collet 30 that includes a set of three vacuum ports 32, 34 and 36. Semiconductor 20 is illustrated, in phantom, as being held against second vacuum port 34 along its side surface 24, as with the arrangement discussed above and as illustrated in FIG. 6. In order to move chip 20 through another 90° rotation, second vacuum port 34 is turned "off", and third vacuum port 36 is turned "on", as shown in FIG. 7 and in a top view in FIG. 8. The switching of the vacuum from second port 34 to third port 36 results in drawing bottom surface 26 of chip 20 toward bottom endface 38 of collet 30. Therefore, the utilization of a third vacuum port results in being able to articulate a semiconductor chip through a complete 180° rotation. Further, a fourth vacuum port may be included to provide yet another articulation to the chip. FIG. 9 is a top view of an exemplary collet 40 including a set of four vacuum ports 42, 44, 46 and 48. As long as the vacuum ports are displaced from one another by an amount less than the average length of a semiconductor chip, the use of four separate vacuum ports will provide for a rotation through 270° (and, if necessary through a full 360° if the first vacuum port is re-activated).

It is to be understood that although the exemplary collets described above are cylindrical in form, various other geometries may be used and do not affect the chip manipulation process as discussed above. As long as the collet is formed to include two or more vacuum ports, with the capability to switch the ports "on" and "off", the arrangement has met the spirit and scope of the present invention.

What is claimed is:

1. An apparatus for picking up and handling a semiconductor piece part, the apparatus comprising a collet comprising a plurality of vacuum ports disposed through the length of the collet and positioned in relative proximity to one another, each vacuum port being separately controlled such that only one vacuum port is activated at a time so that a semiconductor piece part is attracted to the termination of the activated vacuum port and is capable of being articulated through 90° by turning off the activated port and activating another vacuum port of the plurality of vacuum ports.

2. Apparatus as defined in claim 1 wherein the plurality of vacuum ports comprises a pair of vacuum ports such that a semiconductor piece part can be articulated 90°.

3. Apparatus as defined in claim 1 wherein the collet comprises a set of three vacuum ports such that a semiconductor piece part can be articulated through a total of 180°.

4. Apparatus as defined in claim 1 wherein the collet comprises a set of four vacuum ports such that a semiconductor piece part can be articulated through a total of 270°.

5. A method of re-orienting a semiconductor piece part during an assembly process, the method comprising the steps of:

a) approaching a semiconductor piece part with a collet including a plurality of vacuum ports, a first vacuum port being activated and drawing up the semiconductor piece part;

b) turning "off" the vacuum associated with the first vacuum port and turning "on" the vacuum associated with a second vacuum port to rotate the semiconductor piece part 90°.

6. The method as defined in claim 5 wherein the collet includes a set of three vacuum ports and the method comprises the additional step of:

c) turning "off" the vacuum associated with the second vacuum port and turning "on" the vacuum associated with a third vacuum port to rotate the semiconductor piece part an additional 90°.

7. The method as defined in claim 6 wherein the collet includes a set of four vacuum ports and the method comprises the additional step of:

d) turning "off" the vacuum associated with the third vacuum port and turning "on" the vacuum associated with a fourth vacuum port to rotate the semiconductor piece part an additional 90°.

* * * * *